United States Patent [19]

Reeves

[11] Patent Number: 5,025,195
[45] Date of Patent: Jun. 18, 1991

[54] CURRENT MONITORING

[75] Inventor: Malcolm R. Reeves, Chippenham, Great Britain

[73] Assignee: Westinghouse Brake and Signal Holdings Limited, Wiltshire, England

[21] Appl. No.: 444,289

[22] Filed: Dec. 1, 1989

[30] Foreign Application Priority Data

Feb. 8, 1989 [GB] United Kingdom ............... 8902793

[51] Int. Cl.$^5$ .................................. G08B 21/00
[52] U.S. Cl. ................... 315/136; 324/121; 324/133; 340/654; 340/664
[58] Field of Search .......... 315/135, 136, 77; 324/76 R, 115, 116, 127, 133; 340/635, 641, 642, 664, 650, 651, 654, 655, 659

[56] References Cited

U.S. PATENT DOCUMENTS

| 3,170,070 | 2/1965 | Schuchard | 340/654 |
|---|---|---|---|
| 3,252,058 | 5/1966 | Close | 340/659 |
| 3,298,011 | 1/1967 | Lehnhardt | 340/659 |
| 3,509,460 | 4/1970 | Mizrahi . | |
| 3,524,133 | 8/1970 | Arndt | 340/654 |
| 3,566,266 | 2/1971 | Bloom . | |
| 3,670,231 | 6/1972 | Maddick | 340/659 |
| 3,870,954 | 3/1975 | Hanson et al. . | |
| 3,913,023 | 10/1975 | Dolch | 340/659 |
| 3,967,257 | 6/1976 | Hager | 315/135 |
| 4,558,310 | 12/1985 | McAllice | 340/664 |
| 4,572,987 | 2/1986 | Embrey et al. | 315/135 |
| 4,583,086 | 4/1986 | Andrews et al. | 340/664 |
| 4,584,555 | 4/1986 | Domorazek | 340/650 |
| 4,931,778 | 6/1990 | Guajardo | 340/664 |

FOREIGN PATENT DOCUMENTS

| 0161947 | 11/1985 | European Pat. Off. . |
| 2223039 | 11/1973 | Fed. Rep. of Germany . |
| 2460053 | 7/1975 | Fed. Rep. of Germany . |
| 2748323 | 5/1979 | Fed. Rep. of Germany . |
| 3644226 | 7/1988 | Fed. Rep. of Germany . |
| 2311476 | 12/1976 | France . |

Primary Examiner—Eugene R. LaRoche
Assistant Examiner—Son Dinh
Attorney, Agent, or Firm—Marshall, O'Toole, Gerstein, Murray & Bicknell

[57] ABSTRACT

A circuit arrangement includes a lamp filament (1) as a load and a resistor (2) in series with the filament. For detecting the current through the load, the source of a MOSFET (6) is connected with the end of the resistor remote from the filament, the drain of the MOSFET being connected with the other end of the resistor via the primary winding of a step-up transformer (7) and a further resistor (8), a diode (9) being connected between the source and the drain of the MOSFET. If the MOSFET is turned on by an appropriate voltage at an input (11) connected to its gate, the voltage across the secondary winding of the transformer is substantially proportional to the value of the current through the filament.

12 Claims, 1 Drawing Sheet

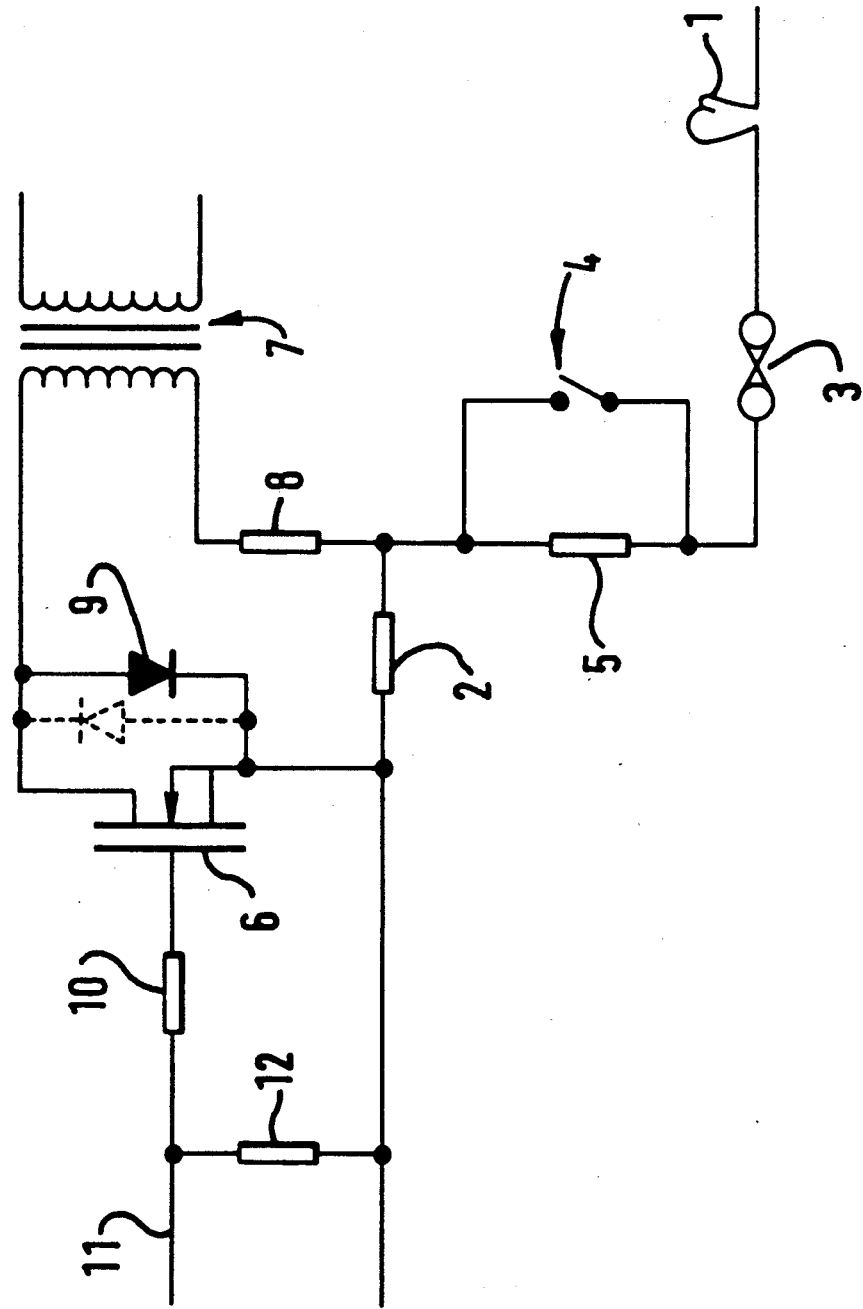

CURRENT MONITORING

The present invention relates to current monitoring.

It is a common requirement to monitor the value of a current flowing through a load. For example, in the field of railway signalling it is common to monitor the current flowing through a filament of a lamp of a set of signal lamps to check that it is the correct value for a given condition.

According to the present invention from one aspect, there is provided a circuit arrangement including a load, resistive means through which at least part of the current through the load flows and detection means for providing a signal dependent on the value of the said current, the detection means comprising a circuit branch connected across the resistive means and including a field-effect transistor (FET) and having an input connected with the gate of the FET for receiving a voltage for use in turning on the FET, the circuit arrangement being such that, if the FET is turned on, the circuit branch provides an output voltage which is substantially proportional to the value of the said current.

According to the present invention from another aspect, there is provided a circuit arrangement including a load, resistive means in series with the load and detection means for providing a signal dependent on the value of a current through the load, the detection means comprising:

(a) a field-effect transistor (FET) whose source is connected with the end of the resistive means remote from the load;
(b) a transformer having a primary winding and a secondary winding, one end of the primary winding being connected with the drain of the FET and the other end being connected with the other end of the resistive means; and
(c) an input connected with the gate of the FET for receiving a voltage for use in turning on the FET, the arrangement being such that, if the FET is turned on, the voltage across the secondary winding of the transformer is substantially proportional to the value of the said current.

The present invention will now be described, by way of example, with reference to the single figure of the accompanying drawing, which shows one example of a circuit arrangement according to the present invention.

In the drawing, reference numeral 1 designates the filament of a lamp of a set of signal lamps of a railway signalling system. Current to the filament is applied via a resistor 2 and a fuse 3, both in series with the filament. The current through the filament 1 is low if a switch 4 is open and a resistor 5 is in the current path (this being known as the "cold filament" current) and the current is higher, for full brightness, if switch 4 is closed (this current being known as the "hot filament" current).

For monitoring the current through the filament 1 for testing its value, a detection circuit is connected across resistor 2. The detection circuit comprises a metal-oxide-silicon transistor (MOSFET) 6 whose source is connected to the end of resistor 2 remote from resistor 5 and whose drain is connected via the primary winding of a step-up transformer 7 and a resistor 8 to the junction between resistors 2 and 5. Resistor 8 has the function of limiting current through the primary winding of transformer 7 if there is a current surge through it when the lamp is turned on. A diode 9 has its anode connected to the drain of MOSFET 6 and its cathode connected to the source of MOSFET 6. The gate of MOSFET 6 is connected via a resistor 10 to an input 11, a resistor 12 being connected between input 11 and true source of MOSFET 6.

In operation, the resistor 2 acts as a sensing resistor for the current which passes through the filament 1. The voltage drop across resistor 2, as a result of the current, drives the circuit branch connected across it, which is basically a forward converter circuit with a bi-directional dissipative clamp. By operation of this circuit at a low voltage and as a result of MOSFET 6, the circuit is not sensitive to current direction. The dissipative clamp is formed by the internal diode of the MOSFET (shown in broken lines in the drawing) and the diode 9. If desired, the diode 9 could be omitted in some applications, in which case the dissipative clamp would be uni-directional and provided by the internal diode of MOSFET 6. The transformer 7 steps up the voltage to a usable level and also provides isolation. The transformer 7 could be of split-bobbin construction to guarantee isolation, provided that its secondary winding is driving a high impedance load.

The voltage across the secondary winding of the transformer 7 is proportional to the current through the filament 1 only when MOSFET 6 is turned on. Thus, for testing the value of this current, an appropriate voltage is applied to input 11 for turning on MOSFET 6, so that there is produced across the secondary winding of transformer 7 a voltage proportional to the current. For subsequent processing of the value of the voltage drop, the secondary winding of transformer 7 is typically coupled to an analogue to digital converter whose operation may be synchronised with the application of a voltage to input 11 for testing purposes.

I claim:

1. A circuit arrangement including a load, resistive means through which at least part of the current through the load flows and detection means for providing a signal dependent on the value of the said current, the detection means comprising a circuit branch connected across the resistive means and including a field-effect transistor (FET), a transformer having a primary winding which is connected to the FET and an input connected with the gate of the FET for receiving a voltage for use in turning on the FET, the circuit arrangement being such that, if the FET is turned on, the circuit branch provides said signal as an output voltage across said secondary winding of said transformer, said output voltage being substantially proportional to the value of the said current.

2. A circuit arrangement according to claim 1, wherein a diode is connected between the source and the drain of the FET.

3. A circuit arrangement according to claim 1, wherein one end of the primary winding is connected with the drain of the FET, the source of the FET is connected with the end of the resistive means remote from the said load and the other end of the primary winding is connected with the other end of the resistive means.

4. A circuit arrangement according to claim 3, wherein the other end of the primary winding is connected with the other end of the resistive means via further resistive means.

5. A circuit arrangement according to claim 1, wherein said resistive means is in series with the said load.

6. A circuit arrangement according to claim 1, wherein the FET is a metal-oxide-silicon FET (MOSFET).

7. A circuit arrangement according to claim 1, wherein resistive means is connected between the said input and the gate of the FET.

8. A circuit arrangement according to claim 7, wherein the resistive means between the said input and the gate of the FET is a single resistor.

9. A circuit arrangement according to claim 1, wherein resistive means is connected between the said input and the source of the FET.

10. A circuit arrangement according to claim 9, wherein the resistive means between the said input and the source of the FET is a single resistor.

11. A circuit arrangement according to claim 4, wherein the said further resistive means is a single resistor.

12. A circuit arrangement according to claim 1, wherein the load comprises a lamp filament.

* * * * *